(12) United States Patent
Zhu et al.

(10) Patent No.: US 11,796,825 B2
(45) Date of Patent: Oct. 24, 2023

(54) DISPLAY APPARATUS, VR APPARATUS AND DISPLAY METHOD

(71) Applicant: BOE TECHNOLOGY GROUP CO., LTD., Beijing (CN)

(72) Inventors: Jinye Zhu, Beijing (CN); Jian Gao, Beijing (CN); Fang Cheng, Beijing (CN); Tao Hong, Beijing (CN); Jing Yu, Beijing (CN); Tianyang Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 143 days.

(21) Appl. No.: 17/363,217

(22) Filed: Jun. 30, 2021

(65) Prior Publication Data
US 2022/0171206 A1    Jun. 2, 2022

(30) Foreign Application Priority Data
Nov. 30, 2020    (CN) .......................... 202011376907.X

(51) Int. Cl.
*G02F 1/1335* (2006.01)
*G02B 27/09* (2006.01)
*G02B 27/01* (2006.01)
*H10K 50/858* (2023.01)

(52) U.S. Cl.
CPC ..... *G02B 27/0961* (2013.01); *G02B 27/0172* (2013.01); *G02F 1/133526* (2013.01); *H10K 50/858* (2023.02)

(58) Field of Classification Search
CPC .................................................. G02F 1/133526
See application file for complete search history.

(56) References Cited

U.S. PATENT DOCUMENTS

| | | | |
|---|---|---|---|
| 2012/0242874 A1* | 9/2012 | Noudo | H01L 27/1464 348/294 |
| 2016/0334637 A1* | 11/2016 | Saisho | G02B 27/48 |
| 2019/0045176 A1* | 2/2019 | Ratcliff | G02B 30/36 |
| 2019/0086582 A1* | 3/2019 | Lo | G02B 3/08 |
| 2021/0191128 A1* | 6/2021 | Lo | G02B 27/0172 |

* cited by examiner

*Primary Examiner* — Edmond C Lau
(74) *Attorney, Agent, or Firm* — DINSMORE & SHOHL LLP

(57) ABSTRACT

A display apparatus including: a display screen including multiple light-emitting points and a first side, wherein light generated by the light-emitting points emits from the first side; and a microlens array provided on the first side of the display screen, the microlens array includes multiple microlenses arranged in an array, an orthographic projection of the microlens array on the display screen covers the display screen, and the display screen is provided on a focal surface of the microlens array. The focal lengths of the multiple microlenses increase sequentially from the center of the microlens array to the edge of the microlens array, so that a beam width of the light that is emitted from each light-emitting point of the display, transmits through the microlens array and is incident into a pupil of a human eye is less than a preset threshold.

15 Claims, 7 Drawing Sheets

DISPLAY APPARATUS, VR APPARATUS AND DISPLAY METHOD

CROSS-REFERENCE OF RELATED APPLICATIONS

This application claims the priority to the Chinese patent application for invention No. 202011376907.X, filed on Nov. 30, 2020, which is hereby incorporated by reference in its entirety.

TECHNICAL FIELD

The present disclosure relates to the field of display technology, in particular to a display apparatus, a VR apparatus, and a display method.

BACKGROUND TECHNOLOGY 3D display replacing 2D display is bound to be the future development trend, but the current 3D display products are all parallax type. There is the contradiction between human eye focus and convergence. People feel dizzy after watching it, and cannot watch for a long time. It can be said that parallax type 3D technology cannot meet people's demand for stereoscopic display at present. Even though the light field display demonstrations currently appearing at major exhibitions such as SID have tens of viewpoints and contain information for tens of directions, they are essentially parallax 3D, which is a 3D image fused by the brain. It is not a picture formed by actual image points, so the contradiction between human eye focus and convergence can only be weakened but not eliminated. In other words, 3D display products based on the principle of parallax cannot fully meet the needs of people for stereoscopic display.

SUMMARY OF THE INVENTION

In accordance with one aspect of the present disclosure, a display apparatus is provided, including:
a display screen including multiple light-emitting points and a first side, wherein light generated by the light-emitting points emits from the first side; and
a microlens array provided on the first side of the display screen, the microlens array includes multiple microlenses arranged in an array, an orthographic projection of the microlens array on the display screen covers the display screen, and the display screen is provided on a focal surface of the microlens array;
wherein focal lengths of the multiple microlenses increase sequentially from the center of the microlens array to the edge of the microlens array, so that a beam width of the light that is emitted from each light-emitting point of the display, transmits through the microlens array and is incident into a pupil of a human eye is less than a preset threshold.

In some embodiments of the present disclosure, the multiple microlenses are spherical lenses,
radius of curvature of the multiple microlenses increases sequentially from the center of the microlens array to the edge of the microlens array; and/or
arch rises of the multiple microlenses decreases sequentially from the center of the microlens array to the edge of the microlens array.

In some embodiments of the present disclosure, the microlens array includes multiple concentric annular regions, a center of the annular regions is the center of the microlens array, and the focal lengths of the microlens in the same annular region is the identical.

In some embodiments of the present disclosure, a difference between the viewing angles for two adjacent annular regions with respect to the human eye is a preset value.

In some embodiments of the present disclosure, the microlens array satisfies $$p_{lens} \geq \sqrt{\frac{e \times p_{pixel}}{2} + a\lambda L}$$

$$f = \frac{L \times p_{lens}}{e}$$

$$N \geq \frac{\varphi \times f}{L \times p_{pixel}}$$

wherein, $p_{lens}$ is an diameter of a microlens in the microlens array, e is a movable range of a single human eye, $p_{pixel}$ is a pixel interval of the display screen, a is a diffraction coefficient of the microlens, $\lambda$ is a wavelength of light displayed on the display screen, L is a distance from the human eye to the microlens array, f is a focal length of a microlens at the center of the microlens array, N is a number of viewpoints entering the pupil of the single human eye, and $\varphi$ is a diameter of the human eye's pupil.

In some embodiments of the present disclosure, the display screen comprises a plurality of pixel sets arranged in an array, the plurality of pixel sets is in one-to-one correspondence with the multiple microlenses, and a number of the light-emitting points in the pixel sets meets:

$$M = \frac{e \times N}{\varphi}$$

wherein M is the number of light-emitting points in the pixel set.

In some embodiments of the present disclosure, a shape of the microlens is a regular polygon.

In some embodiments of the present disclosure, the microlens array further comprises a light-shielding material disposed between adjacent microlenses.

In some embodiments of the present disclosure, the shape of the microlens is a regular hexagon.

In some embodiments of the present disclosure, the display screen is an OLED display screen, the OLED display screen includes an organic light emitting layer, and the organic light emitting layer is disposed on the focal plane of the microlens array.

In some embodiments of the present disclosure, the display screen is a liquid crystal display screen, the liquid crystal display screen includes a color filter, and the color filter is arranged on the focal plane of the micro lens array.

In accordance with another aspect of the present disclosure, there is provided a virtual reality (VR) apparatus comprising the above display apparatus according to the present disclosure.

In some embodiments of the present disclosure, the microlens array includes 6 annular regions, and a difference between the viewing angles for two adjacent annular regions with respect to the human eye is 5°.

In some embodiments of the present disclosure, the microlenses in three annular regions adjacent to the center of the microlens array among the 6 annular regions have the same focal length, the same radius of curvature, and the same arch rise.

In accordance with a further aspect of the present disclosure, there is provide a display method, including:

providing a display screen, the display screen including multiple light-emitting points and a first side, wherein light generated by the light-emitting points emits from the first side; and providing a microlens array on the first side of the display screen, the microlens array includes multiple microlenses arranged in an array, an orthographic projection of the microlens array on the display screen covers the display screen, and the display screen is provided on a focal surface of the microlens array, focal lengths of the multiple microlenses increase sequentially from the center of the microlens array to the edge of the microlens array; and the display screen displaying an image, a beam width of the light that is emitted from each light-emitting point of the display, transmits through the microlens array and is incident into a pupil of a human eye is less than a preset threshold.

In some embodiments of the present disclosure, the multiple microlenses are spherical lenses, radius of curvature of the multiple microlenses increases sequentially from the center of the microlens array to the edge of the microlens array; and/or arch rises of the multiple microlenses decreases sequentially from the center of the microlens array to the edge of the microlens array.

In some embodiments of the present disclosure, the microlens array includes multiple concentric annular regions, a center of the annular regions is the center of the microlens array, and the focal lengths of the microlens in the same annular region is the identical.

In some embodiments of the present disclosure, a difference between the viewing angles for two adjacent annular regions with respect to the human eye is a preset value.

In some embodiments of the present disclosure, the microlens array satisfies $$p_{lens} \geq \sqrt{\frac{e \times p_{pixel}}{2} + a\lambda L}$$

$$f = \frac{L \times p_{lens}}{e}$$

$$N \geq \frac{\varphi \times f}{L \times p_{pixel}}$$

wherein, $p_{lens}$ is a diameter of a microlens in the microlens array, e is a movable range of a single human eye, $p_{pixel}$ is a pixel interval of the display screen, a is a diffraction coefficient of the microlens, $\lambda$ is a wavelength of light displayed on the display screen, L is a distance from the human eye to the microlens array, f is a focal length of a microlens at the center of the microlens array, N is a number of viewpoints entering the pupil of the single human eye, and $\varphi$ is a diameter of the human eye's pupil.

In some embodiments of the present disclosure, the display screen comprises a plurality of pixel sets arranged in an array, the plurality of pixel sets is in one-to-one correspondence with the multiple microlenses, and a number of the light-emitting points in the pixel sets meets:

$$M = \frac{e \times N}{\varphi}$$

wherein M is the number of light-emitting points in the pixel set.

BRIEF DESCRIPTION OF DRAWINGS

In order to more clearly describe the technical solutions in the embodiments of the present disclosure, the following will briefly introduce the drawings needed in the description of the embodiments. Obviously, the drawings in the following description are only some embodiments of the present disclosure. For those of ordinary skill in the art, other drawings can be obtained based on these drawings without creative work.

DETAILED DESCRIPTION OF THE EMBODIMENTS

Figure 1:
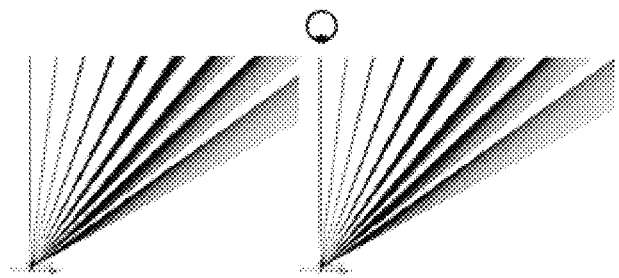
FIG. 1 is a schematic simulation diagram showing the light beams emitted by the pixels at the edge of the screen and the pixels at the center of the screen during true light field display in the prior art.

In order to explain the present disclosure more clearly, the following further describes the present disclosure with reference to preferred embodiments and drawings. Similar components in the drawings are denoted by the same reference numerals. Those skilled in the art should understand that the content described in detail below is illustrative rather than restrictive, and should not be used to limit the scope of protection of the present disclosure.

In the prior art, true light field display is usually used to solve the problems of parallax 3D. True light field display is an image formed by actual image points in space, which is similar to the real world presentation principle, so there will be no contradiction between human eye focus and convergence. It is the development direction for a display.

Normally, the requirements of true light field display, theoretically, the beam width of the light beam emitted from one viewpoint when it enters the pupil of a human eye cannot be greater than 2 mm, and at least two viewpoints enter the pupil of a single eye to form image planes with different depths of field in space. The microlens array has the function of converging the light emitted by the sub-pixels, so true light field display can be realized by proper design. But because the microlens is a single lens, there is aberration, so when the ordinary microlens array is attached to the display screen to display, as shown in FIG. 1, the left image in FIG. 1 is the light emitted by the pixels at the edge of the screen, and the right image is the light emitted by the pixel at the center of the screen. It can be seen that the beam width close to the main optical axis of the microlens is small and can meet the requirements of true light field display. But as the angle between the secondary optical axis and the main optical axis gradually increases, the beam width of the light gradually becomes wider, which cannot meet the requirements of true light field display. When people standing in the center to see, pixels close to the center of the display screen can form a true light field, while other edge pixels of the screen cannot form a true light field. The screen has a small light field display area and low pixel utilization, with a small viewing angle, such as the use rate of a 3.2 in screen is only 18%.

In view of the foregoing problems, an embodiment of the present disclosure provides a display apparatus, including:

a display screen including multiple light-emitting points and a first side, wherein light generated by the light-emitting points emits from the first side; and a microlens array provided on the first side of the display screen, the microlens array includes multiple microlenses arranged in an array, an orthographic projection of the microlens array on the display screen covers the display screen, and the display screen is provided on a focal surface of the microlens array;

wherein focal lengths of the multiple microlenses increase sequentially from the center of the microlens array to the edge of the microlens array, so that a beam width of the light that is emitted from each light-emitting point of the display, transmits through the microlens array and is incident into a pupil of a human eye is less than a preset threshold.

In this embodiment, the microlens array is designed so that the focal length of the microlens in the microlens array increases from the center of the microlens array to the edge of the microlens array, so that the light that is emitted from each light-emitting point of the display, transmits through the microlens array and is incident into a pupil of a human eye is less than a preset threshold. This can increase the display area of the true light field display, increase the viewing angle of the true light field display, and improve the pixel utilization of the display screen in the true light field display. It has a wide range of application prospect.

Figure 2:
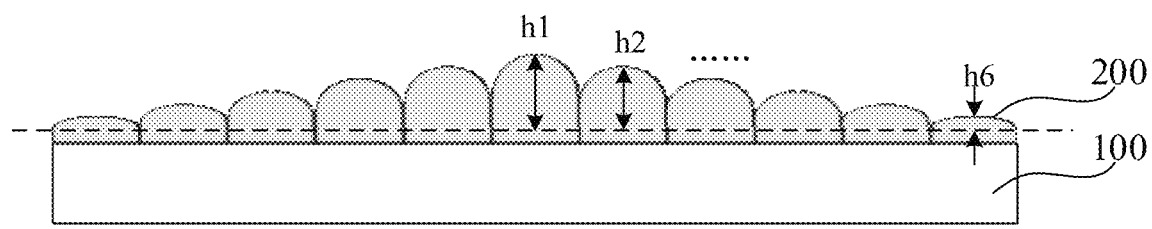
FIG. 2 is a schematic cross-sectional view of a display apparatus according to an embodiment of the present disclosure.

In a specific example, as shown in FIG. 2, the light field display apparatus according to the present disclosure includes a display screen 100 and a microlens array 200 arranged on the light emission side (first side) of the display screen 100. The microlens array 200 includes a plurality of microlenses arranged in an array. The orthographic projection of the microlens array 200 on the display screen 100 covers the display screen 100, and the display screen 100 is arranged on the focal plane of the microlens array 200. In this way, the light emitted from the light-emitting points of the display screen 100 can be converted into a collimated beam after passing through the microlenses. For example, in some embodiments according to the present disclosure, the display screen 100 may be an OLED display screen, and the organic light-emitting layer of the OLED may be disposed on the focal plane of the microlens array 200. In some other embodiments according to the present disclosure, the display screen 100 may be a liquid crystal display screen, and the color filter layer of the liquid crystal display screen may be disposed on the focal plane of the microlens array 200. The focal length f of each microlens of the microlens array 200 gradually increases outward from the center point of the microlens array, so that the beam width of the light that is emitted from each light-emitting point of the display screen 100, transmits through the microlens array and is incident into a pupil of a human eye is less than a preset width threshold. It is worth noting that the light-emitting point is the smallest light-emitting unit, and the sub-pixel may include multiple light-emitting points. When the sub-pixel is the smallest light-emitting unit, the light-emitting point is a sub-pixel.

In the present disclosure, in order to achieve true light field display, generally the width of the light beam incident into the pupil of the human eye should be less than 2 mm. Therefore, the preset width threshold can be 2 mm. 2 mm is only the maximum beam width for true light field display. In order to achieve a better true light field display effect, the width threshold can also be appropriately adjusted during design to take a value less than 2 mm, such as 1 mm or 0.5 mm while meeting the process settings. Therefore, the width threshold is not specifically limited here, as long as true light field display can be realized.

In addition, it should be noted that although the focal length f of the microlens is used as the limiting condition here, those skilled in the art should understand that for a microlens, its focal length, arch rise, and radius of curvature are clearly mathematically related. When describing the changing law of the focal length, correspondingly, the arch rise and the radius of curvature also have a clear law of change. The limiting conditions for the focal length are also the limiting conditions for the arch rise and the radius of curvature. That is, the focal length f is represented by the radius of curvature R and the arch rise h.

Specifically, when the microlens is a spherical lens, the focal length f of each microlens is defined to increase from the center to the edge of the microlens array, that is, the radius of curvature R of each microlens is defined to increase sequentially from the center to the edge of the microlens array. The radius of curvature R of the microlens can be expressed as:

$$R = f \times (n-1); \quad (1)$$

wherein f is the focal length of the microlens, and n is the refractive index of the microlens.

Figure 3:
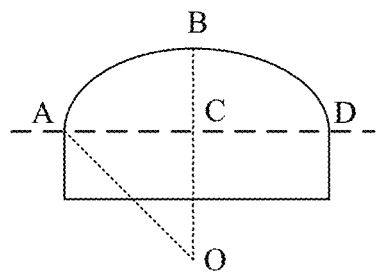
FIG. 3 is a schematic diagram showing the geometric relationship between the arch rise and the radius of curvature of the microlens.

At the same time, referring to FIG. 3, AO=BO=radius of curvature R, AD is the diameter of the microlens $p_{lens}$, BC is the arch rise h, and $\triangle$AOC forms a right triangle, because $AO^2 = AC^2 + CO^2$, therefore, the arch rise satisfies:

$$R^2 = \left(\frac{p_{lens}}{2}\right)^2 + (R-h)^2; \quad (2)$$

wherein R is the radius of curvature of the microlens, $p_{lens}$ is the diameter of the microlens, and h is the arch rise. Therefore, according to the relationship of expression (2), when the focal length f of each microlens is defined to increase gradually from the center to the edge of the microlens array, the arch rise h of each microlens is also defined gradually decrease from the center to the edge of the microlens array. That is, as shown in FIG. 2, the arch rises h1, h2 . . . h6 are gradually decreased.

In some optional embodiments, the microlens array 200 includes a plurality of concentric annular regions, the center of the annular regions is the center of the microlens array 200, and the focal length of the microlenses in the annular regions changes region by region from the center of the microlens array.

In this embodiment, considering the processing level in practical applications, the multiple microlenses in each annular region have the same focal length, that is, they also have the same radius of curvature and arch rise. In other words, the parameters of the microlenses located in one annular region are the same first parameter, and the parameters of the microlenses located in another annular region are the same second parameter. This is specifically expressed as the focal length of the microlens in each annular region changes region by region while meeting the requirements of gradually changing from the center point of the microlens array, so as to achieve a good true light field display effect while meeting the technological limit.

Specifically, according to the light field display apparatus of the embodiment of the present disclosure, the annular regions are divided according to the difference between the viewing angles of two adjacent annular regions with respect to the human eye satisfying a preset value, for example, the annular regions of the microlens array 200 are set with a difference of 5°.

Figure 4:
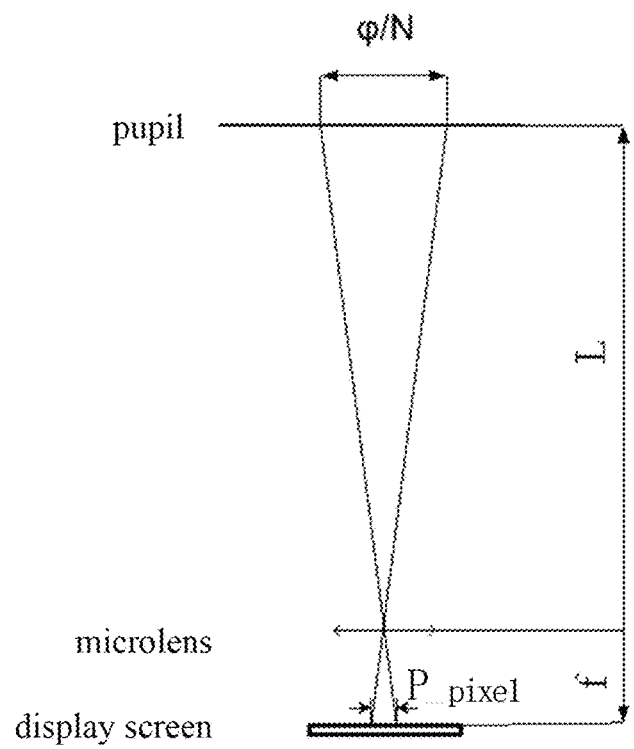
FIG. 4 is a model of a pupil of a human eye established according to an embodiment of the present disclosure.

In order to further understand the structure of the display apparatus of the embodiment of the present disclosure, the design principle of the microlens array of the light field display apparatus of the present disclosure will be described below with reference to FIGS. 4 to 6. It should be noted that the diameters of the microlenses in the microlens array of the present disclosure are equal. This embodiment takes the display apparatus applied to the VR device as an example for description, but this is not intended to limit the application scenario. Other scenarios that may realize true light field are also applicable.

At first, the parameters of the microlens at the center of the microlens array are acquired.

First, referring to FIG. 4, in order to realize the true light field display, the number of viewpoints incident on a single pupil of the human eye is at least two, and a model in which the viewpoints fully fill the pupil of the human eye is established as follows:

$$\frac{\varphi/N}{p_{pixel}} = \frac{L}{f} \quad (3)$$

wherein φ is the pupil diameter, N is the number of viewpoints that enter the pupil of the human eye, $p_{pixel}$ is the pixel interval of the display screen, L is the distance from the microlens array to the pupil, and f is the focal length of the microlens.

Figure 5:
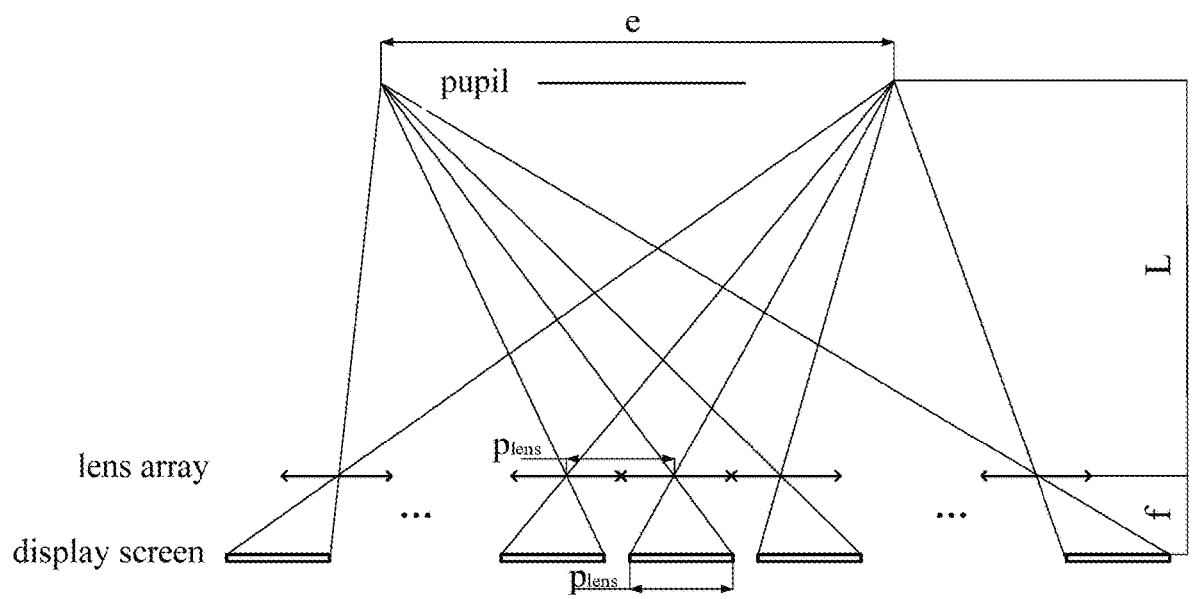
FIG. 5 is an eye movement range model established according to an embodiment of the present disclosure.

Second, referring to FIG. 5, an eye movement range model is established, in which e represents the movable range of the human eye. The premise of establishing the model here is that the pupil of the human eye is the light receiver instead of the human eye. Then the eye movement range model is:

$$\frac{p_{lens}}{e} = \frac{f}{L} \quad (4)$$

It is worth noting that in this embodiment, e represents a range that can be viewed by a single eye by moving, and those skilled in the art should select an appropriate viewing range according to actual application requirements, which will not be repeated here.

Figure 6:
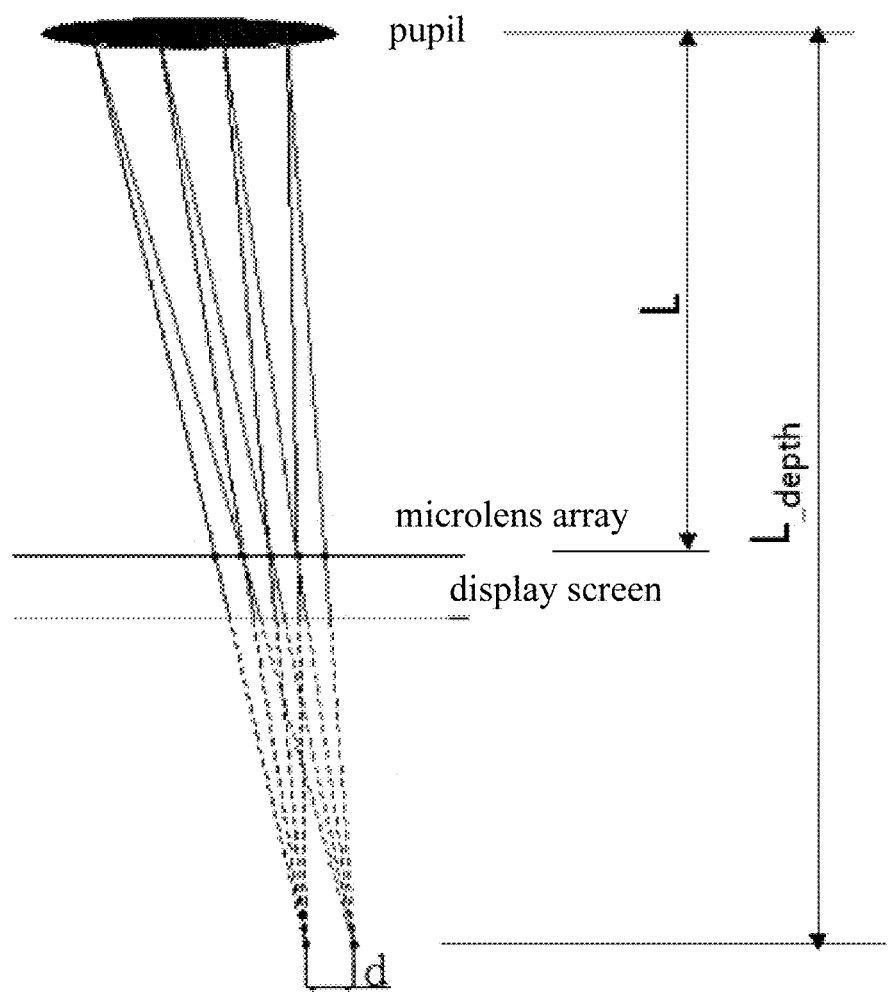
FIG. 6 is a clear imaging model of a true light field microlens established according to an embodiment of the present disclosure.

Third, referring to FIG. 6, in order to make the true light field display capable of clear imaging, a clear imaging model of the microlens is established. FIG. 6 shows that the image light emitted from each light-emitting point of the display screen enters the pupil of the human eye through the microlens array, thereby forming an image with a depth of field of $L_{\_depth}$, and the interval between two image points is d.

In order to be able to image clearly, it is required at least that the image spot radius r≤image point interval d. The image spot in the present disclosure not only considers the geometric image spot, but also considers the color image spot, that is, it satisfies that both the geometric image spot and the color image spot can be separated.

On the basis of meeting the above conditions, the established microlens clear imaging model is:

$$\left(\frac{\varphi/N}{2L} + \frac{a\lambda}{p_{lens}}\right)(L_{\_dept\ h} - L) \le \frac{p_{lens}}{L} \times L_{\_dept\ h} \quad (5)$$

wherein φ is the pupil diameter, N is the number of viewpoints entering the pupil of a single eye, λ is the wavelength of the light displayed on the screen, $p_{lens}$ is the diameter of the microlens, and a is the diffraction coefficient (for example, an example value of a is 1.22). The wavelength λ corresponds to the color of the sub-pixel under the microlens. When the display screen includes sub-pixels of various colors, λ can be the center wavelength of the intermediate color among all colors, for example, the center wavelength of green is 555 nm, but λ is not limited to this. When the display screen includes sub pixels of a single color, λ can be the center wavelength of the color of the sub-pixel, and it is not intended to be specifically limited here.

When looking close to the eye, $L \ll L_{\_depth}$, expression (5) can be simplified as:

$$\frac{\varphi/N}{2L} + \frac{a\lambda}{p_{lens}} \le \frac{p_{lens}}{L} \quad (6)$$

Using expressions (3) and (4) to simplify expression (6), the simplified microlens diameter is:

$$p_{lens} \ge \sqrt{\frac{e \times p_{pixel}}{2} + a\lambda L} \quad (7)$$

Through the above, the minimum diameter of the microlens can be obtained when the image spots can be separated. The larger the diameter of the microlens, the easier it is to separate the image spots. But in practical applications, when the size of the display screen is limited, the smaller the diameter $p_{lens}$ of each microlens, the higher the resolution.

Therefore, it is preferable that the microlens diameter $p_{lens}$ takes the minimum value in the expression (7), because the variables in the expression are all known, so the lens diameter of the center lens in the microlens array is obtained.

Further, returning the microlens diameter $p_{lens}$ to expression (4), the focal length of the microlens at the center point of the microlens array is:

$$f = \frac{L \times p_{lens}}{e} \quad (8)$$

Further put the focal length f into the expression (3), the number of view points into the eye by passing through the central microlens is obtained as:

$$N \geq \frac{\varphi \times f}{L \times p_{pixel}} \quad (9)$$

It is worth noting that, in the light field display apparatus of the embodiment of the present disclosure, the display screen includes a plurality of pixel sets arranged in an array, the pixel sets and the microlenses are in one-to-one correspondence, and the number of light-emitting points included in the pixel set corresponds to number N of view points into the eye. It is worth noting that the light-emitting point is the smallest light-emitting unit, and the sub-pixel may include multiple light-emitting points. When the sub-pixel is the smallest light-emitting unit, the light-emitting point is a sub-pixel. Therefore, the number M of light-emitting points included in each pixel set satisfies:

$$M = \frac{e \times N}{\varphi}$$

Figure 7:
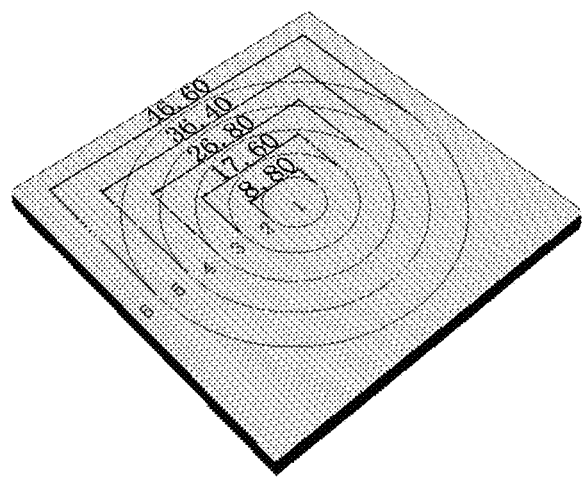
FIG. 7 is a schematic diagram showing the division of regions of the microlens array of the display apparatus according to an embodiment of the present disclosure.

Next, referring to FIG. 7, the microlens array can be divided into annular regions. The example shown in the FIG. 7 is the size and division of a 3.2 in display screen, where the size of each annular region is shown. Specifically, 8.80 represents the diameter of the circle for region 1 is 8.80 mm, 17.60 means the diameter of the circle for region 2 is 17.60 mm, 26.80 means the diameter of the circle for region 3 is 26.30 mm, 36.40 means the diameter of the circle for region 4 is 36.40 mm, and 46.60 means the diameter of circle for region 5 is 46.60 mm.

Optionally, as described above, the microlens array can be divided into a plurality of annular regions with the preset difference. In the example shown in FIG. 7, considering the existing manufacturing process of the microlens, the microlens array is divided into 6 annular regions 1-6 with a preset difference of 5°. The region 1 shown in the drawing is 5° viewing angle from the center of the microlens array, that is, the central area of the microlens array. The lens parameters of the microlenses in this region are the same, and the focal length of the microlenses is the focal length of the center microlens calculated by the above expressions (7) and (8).

Those skilled in the art should understand that the near field viewing distance of the VR display apparatus in the embodiments of the present disclosure takes a value of 60° for the viewing angle, that is, the entire range of the annular region is set with a half viewing angle of 30°. However, those skilled in the art should understand that this is not restrictive. When the display apparatus of the present disclosure is applied to other viewing scenarios, or in other applications where the distance between the display screen of the display apparatus and the human eye needs to be changed, the overall range of viewing angle of the divided regions can also be changed. For example, when the display screen is far from human eyes, the viewing angle can be less than 60°.

After the microlens array is divided into regions as shown in FIG. 7, according to the embodiment of the present disclosure, the focal lengths of the microlenses in each region increase sequentially from the center of the microlens array. Those skilled in the art can obtain the focal lengths of the microlenses in other regions according to the focal length f of the central microlens and according to simulation experiments. For example, according to the principle of sequentially increasing the focal lengths of the microlenses in each region from the center of the microlens array to the edge, with the simulation purpose that light emitting from the light emitting points of the display screen and incident on the pupil of the human eye through the microlens array has a beam width less than the preset width threshold, the focal length f, radius of curvature and arch rise of the microlens in other regions can be obtained. Table 1 shows the corresponding values of the radius of curvature and the arch rise of the regions in the microlens array according to an example. The example is illustrated based on the above design principle and the size of a 3.2 in display screen. However, those skilled in the art should understand that the specific values in the table are not meant to limit the present disclosure. Those skilled in the art can follow actual examples and reasonably determine the specific value of the regions under the device structure conditions designed in the present disclosure above and in accordance with the simulation test of conventional techniques in the prior art.

TABLE 1

| | Region 1 | Region 2 | Region 3 | Region 4 | Region 5 | Region 6 |
|---|---|---|---|---|---|---|
| Radius of curvature (mm) | 1 | | | 1.07 | 1.14 | 1.23 |
| Arch rise (mm) | 0.0202 | | | 0.0189 | 0.0177 | 0.0164 |

It is worth noting that in the example shown in Table 1, the parameters such as the focal length, radius of curvature, and arch rise of the microlenses in region 1, region 2, and region 3 are very close. Taking the process constraints into consideration, the three regions are adjusted to have the same parameters, the focal length of the microlens in other regions increases sequentially from the center to the edge of the microlens array.

In some optional embodiments, the microlenses have a regular hexagonal structure, the microlenses are closely arranged, and the edges of the microlenses are in close contact.

In some optional embodiments, the microlenses have a regular polygonal structure other than the regular hexagonal structure, and the microlenses are closely arranged. In some cases, due to manufacturing process limitations, close contact between adjacent microlenses may not be possible. At this case, the microlens array may also include light shielding materials arranged between adjacent microlenses, that is, the close arrangement of the microlenses are realized by the light shielding materials.

Figure 8:
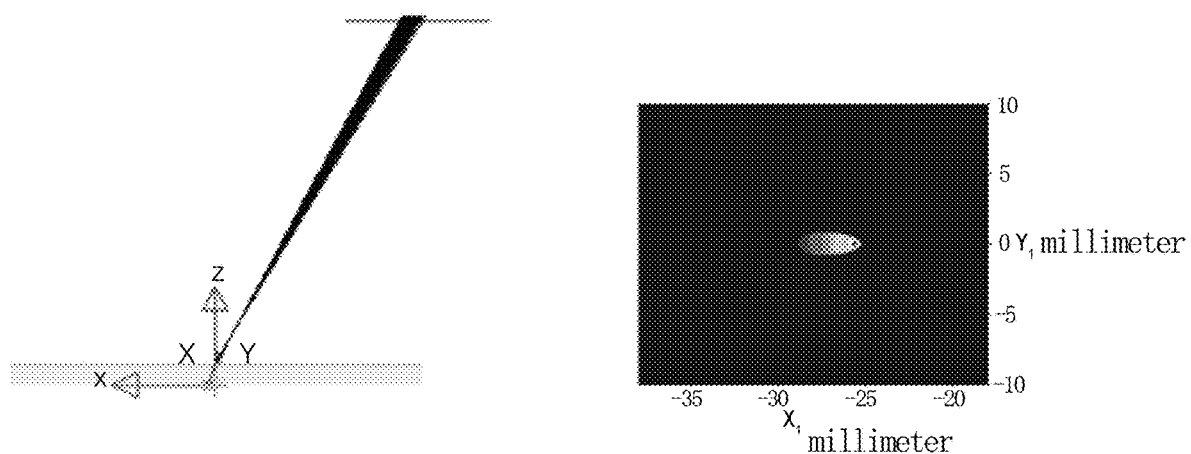
FIG. 8 to FIG. 11 are simulation comparisons of the improvement effect of the true light field display according to a display apparatus of the embodiment of the present disclosure with respect to the prior art.
Figure 9:
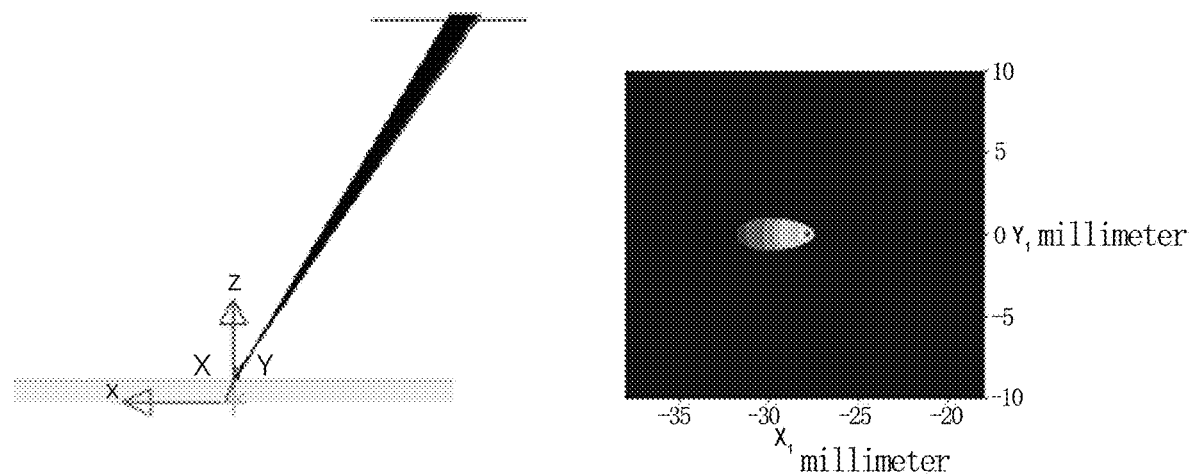
Figure 10:
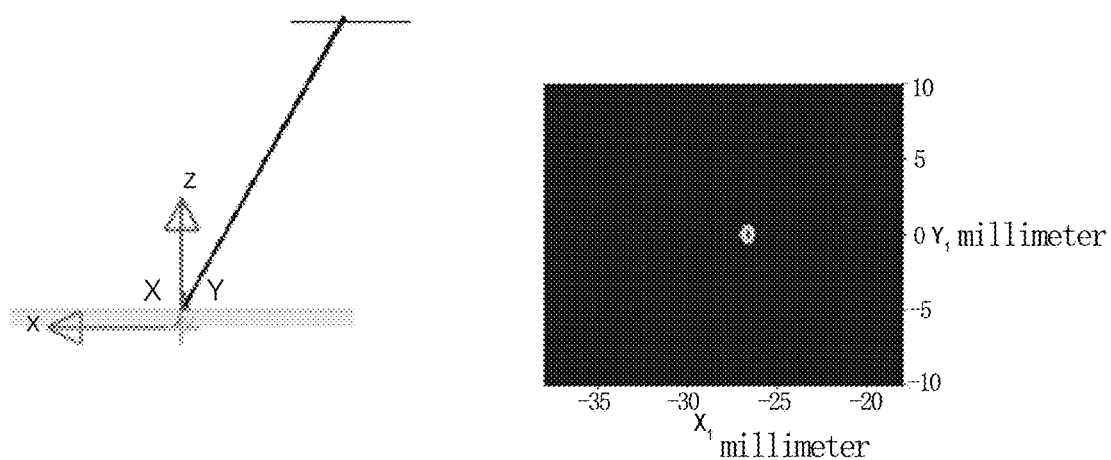
Figure 11:
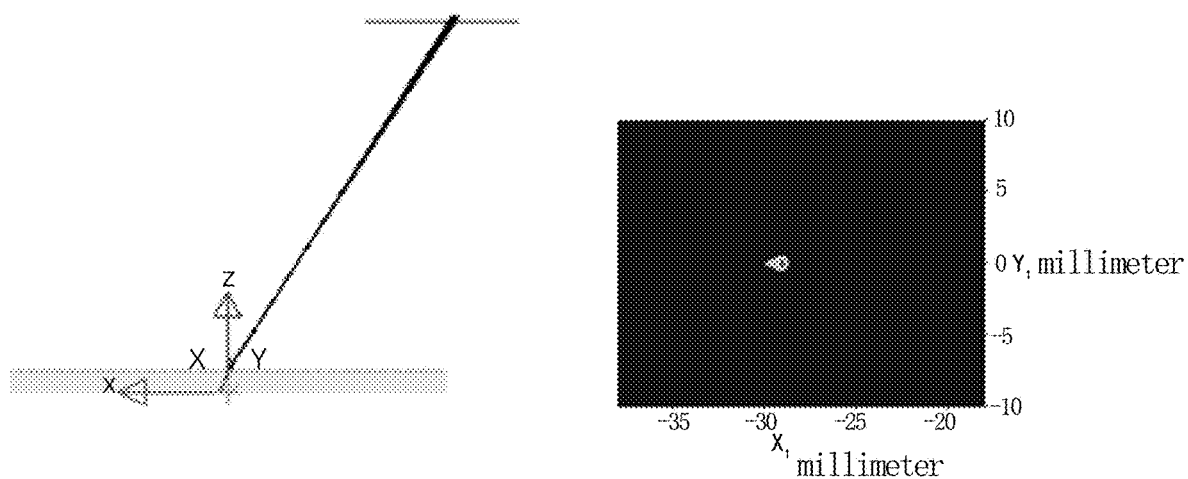

Through the above method, the simulation diagrams in FIG. 8 to FIG. 11 show the improvement effect of the true light field display of the light field display apparatus, where FIG. 8 shows the light spot of the center sub-pixel covered by a single microlens in the region having the half viewing angle of 27.5° in the true light field display apparatus that has not been improved in the existing design. FIG. 9 shows the light spot of the sub-pixel on the left edge covered by a single microlens in the region with a half viewing angle of 27.5° in a true light field display apparatus that has not been improved in the existing design. FIG. 10 shows the light spot of the central sub-pixel covered by a single microlens in the region with the half viewing angle of 27.5° in the improved light field display apparatus of the embodiment of the present disclosure. FIG. 11 shows the light spot of the sub-pixel on the left edge covered by a single microlens in the region with a half viewing angle of 27.5° in an improved light field display apparatus of the embodiment of the present disclosure. It can be seen from the drawings that, compared with the prior art, in the display apparatus of the present disclosure, by designing the microlens array, the focal length of the microlens increases from the center to the edge of the microlens array. For the sub-pixels covered by the micro-lens in the region corresponding to the half viewing angle of 27.5° in the display screen, the light spots of the center sub-pixel and the left edge sub-pixel form a small light spot with a clear boundary, which means that the width of the light beam that diverge to the edge is reduced.

Figure 12:
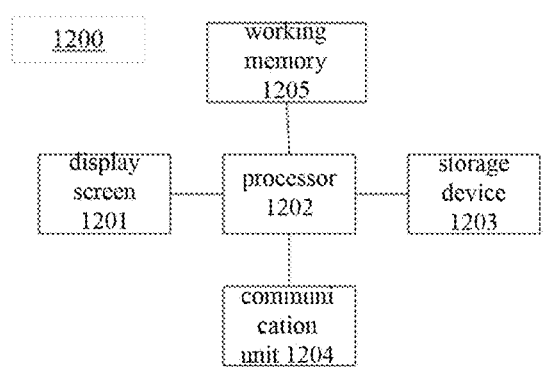
FIG. 12 shows a VR apparatus according to an embodiment of the present disclosure.

FIG. 12 shows a virtual reality (VR) device according to an embodiment of the present disclosure. As shown in FIG. 12, the VR device 1200 includes: a display screen 1201, a processor 1202, a storage device 1203, and a communication unit 1204. The display screen 1201 adopts the above-mentioned display apparatus according to the present disclosure. In the case that the VR device is a head-mounted VR device, there may be two display screens 1201 corresponding to the left eye and the right eye of the user, respectively. The processor 1202 may be any type of processor and may include, but is not limited to, one or more general-purpose processors and/or one or more special-purpose processors (for example, specialized processing chips). The storage device 1203 may include a non-transient storage device or be connected to the non-transient storage device. The non-transient storage device may be any storage device that is non-transient and can realize data storage, and the non-transient storage device can include, but are not limited to, magnetic disk drives, optical storage devices, solid-state storage, floppy disks, floppy magnetic disks, hard disks, magnetic tapes or any other magnetic media, optical disks or any other optical media, ROM (read only memory), RAM (random access memory), cache memory and/or any storage chip or cassette magnetic tape, and/or any other medium from which the computer can read data, instructions and/or code. The non-transient storage device can be detached from the interface. The communication unit 1204 may be any type of device or system capable of communicating with internal devices and/or communicating with the network, and may include, but is not limited to, a modem, a network card, an infrared communication device, a wireless communication device, and/or a chipset, such as a Bluetooth™ device, 1302.11 devices, Wi-Fi devices, WiMax devices, cellular communication devices and/or similar devices.

The VR device 1200 may further include a working memory 1205, which may be any type of working memory capable of storing instructions and/or data that facilitate the work of the processor 1202, and may include, but is not limited to, random access memory and/or read-only storage device.

In some optional embodiments, the microlens array includes 6 annular regions, and the difference in the viewing angles for two adjacent annular regions with respect to the human eye is 5°, so that a good near-eye viewing effect can be achieved.

In some optional embodiments, the focal lengths, radius of curvature, and arch rises of the microlenses in the three adjacent annular regions starting from the center of the microlens array among the six annular regions are the same. Considering the process limitations and the closeness of the parameters such as the focal length, radius of curvature, and arch rise of the microlenses in the three adjacent annular regions from the center, the microlenses in the three annular regions are designed to have the same parameters with the error still being within the acceptable range. Therefore, it can not only meet the design requirements but also simplify the process steps, and has good application value.

In specific implementation, the display apparatus can be any product or component with a 3D display function. Other indispensable components of the display apparatus are understood by those of ordinary skill in the art, and will not be repeated here, and should not be used as a limitation to the present disclosure.

Figure 15:
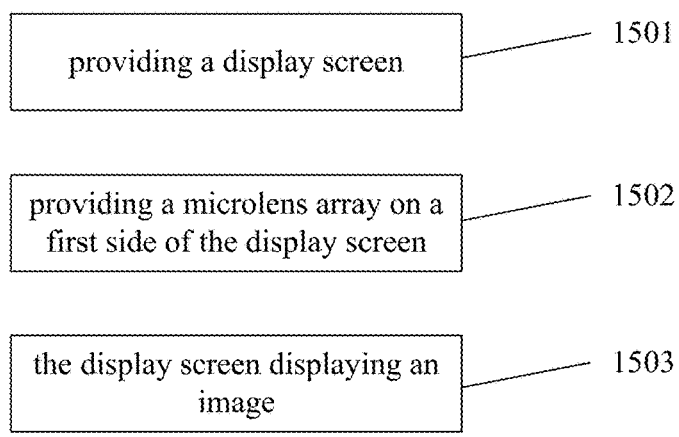
FIG. 15 shows a flowchart of a light field display method of a light field display apparatus according to an embodiment of the present disclosure.

Based on similar inventive concepts, FIG. 15 shows a flowchart of a light field display method of a light field display apparatus according to an embodiment of the present disclosure. As shown in FIG. 15, the light field display method includes:

Step 1501: providing a display screen, the display screen including multiple light-emitting points and a first side, wherein light generated by the light-emitting points emits from the first side;

Step 1502: providing a microlens array on the first side of the display screen, the microlens array includes multiple microlenses arranged in an array, an orthographic projection of the microlens array on the display screen covers the display screen, and the display screen is provided on a focal surface of the microlens array, focal lengths of the multiple microlenses increase sequentially from the center of the microlens array to the edge of the microlens array; and Step 1503: the display screen displaying an image, a beam width of the light that is emitted from each light-emitting point of the display, transmits through the microlens array and is incident into a pupil of a human eye is less than a preset threshold.

In this embodiment, the focal length of each microlens in the microlens array arranged on the light-emitting side of the display screen is sequentially increased from the center point of the microlens array, so that the beam width of the light that is emitted from each light-emitting point of the display, transmits through the microlens array and is incident into a pupil of a human eye is less than a preset threshold. The display area of the true light field display can be increased during the light field display, the viewing angle of the true light field display is increased, and the pixel utilization of the display screen in the true light field display is improved. Therefore, it achieves the purpose of improving the utilization rate of the screen and has a wide range of application prospects.

In some optional embodiments, specifically, arranging the micro lens array on the light exit side of the display screen further includes: the micro lens array satisfies:

$$p_{lens} \geq \sqrt{\frac{e \times p_{pixel}}{2} + a\lambda L};$$

$$f = \frac{L \times p_{lens}}{e};$$

$$N \geq \frac{\varphi \times f}{L \times p_{pixel}}.$$

With the above settings, the display area of the true light field display of the display screen can be effectively increased, and at the same time, the clear display and pixel resolution can be taken into account when the size of the display screen is limited.

In view of the current existing problems, the present disclosure provides a display apparatus and a VR device, and by designing a microlens array, the focal length of each microlens in the microlens array increases from the center to the edge of the microlens array. As a result, the beam width of the light that is emitted from each light-emitting point of the display, transmits through the microlens array and is incident into a pupil of a human eye is less than a preset threshold, which can increase the display area of the true light field display, increase the viewing angle of the true light field display, and improve the pixel utilization rate of the display screen in the true light field display, thus achieving the purpose of improving the screen utilization rate, has a wide range of application prospects.

In the embodiment according to the present disclosure, the display screen as a whole may be roughly arranged on the focal plane of the microlens array. In addition, when the thickness of the display screen is relatively large, in order to further improve the display effect, the relative position of the display screen and the microlens array can be determined more accurately according to the structure of the display screen.

Figure 13:
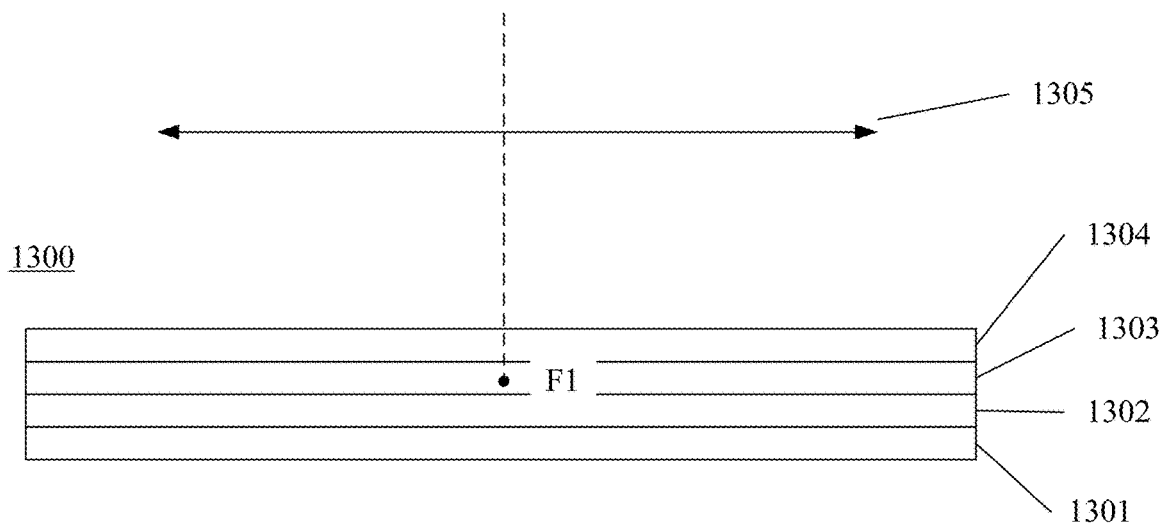
FIG. 13 shows a schematic diagram of a display apparatus according to an embodiment of the present disclosure.

For example, FIG. 13 shows a schematic diagram of a display apparatus according to an embodiment of the present disclosure. In FIG. 13, the display screen 1300 is an OLED display screen, and includes a substrate 1301, an anode 1302, an organic light-emitting layer 1303, and a cathode 1304. The focal point F1 of the microlens of the microlens array 1305 can be more accurately arranged in the organic light-emitting layer 1303, that is, the organic light-emitting layer 1303 is arranged on the focal plane of the microlens array 1305.

Figure 14:
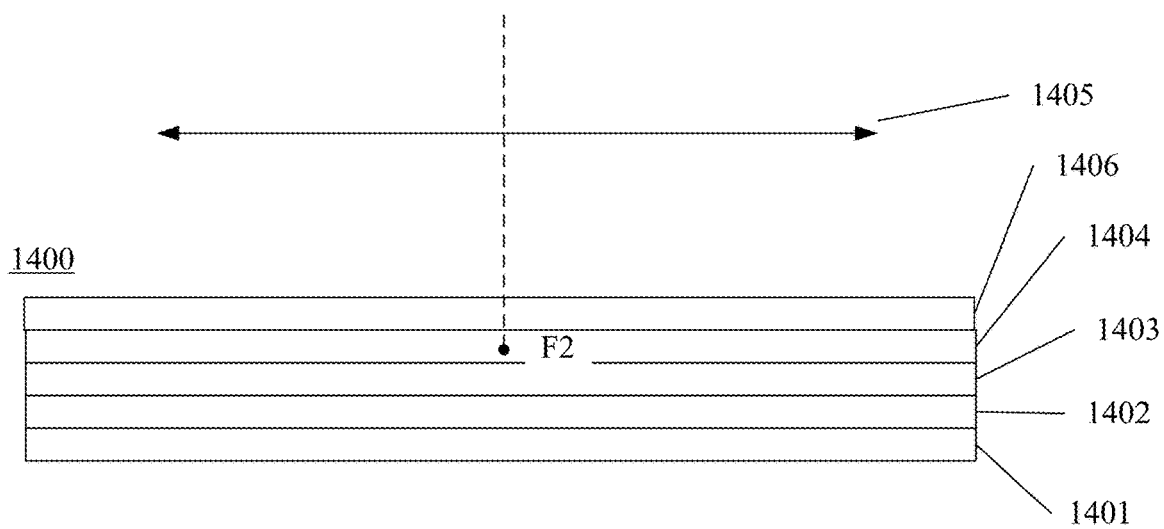
FIG. 14 shows a schematic diagram of a display apparatus according to an embodiment of the present disclosure.

FIG. 14 shows a schematic diagram of a display apparatus according to an embodiment of the present disclosure. In FIG. 14, the display screen 1400 is a liquid crystal display, and includes a backlight module 1401, a lower glass substrate 1402, a liquid crystal layer 1403, a color filter 1404, and an upper glass substrate 1406. The focal point F2 of the microlens of the microlens array 1405 can be more accurately arranged in the color filter 1404, that is, the color filter 1404 is arranged on the focal plane of the microlens array 1405.

In addition, it should be understood that, in some embodiments according to the present disclosure, since the arch rise of the microlens in the microlens array can be reduced from the center to the edge of the microlens array, and the radius of curvature of the microlenses increases from the center toward the edge of the microlens array, the focal points of the microlenses may not be on the same plane, that is, the microlenses may not have a common focal plane. In this case, the display screen can be arranged on the focal plane of the microlens located in the central region of the micro-lens array. For example, for the microlens array shown in FIG. 7, the display screen can be set on the focal plane of the microlens in region 1.

Obviously, the above-mentioned embodiments of the present disclosure are merely examples to clearly illustrate the present disclosure, and are not intended to limit the implementation of the present disclosure. For those of ordinary skill in the art, they can also make changes or variations of different forms on the basis of the foregoing description. It is impossible to list all embodiments here. Any obvious changes or variations derived from the technical solutions of the present disclosure are still within the protection scope of the present disclosure.

What is claimed is:

1. A display apparatus comprising:
a display screen comprising multiple light-emitting points and a first side, wherein light generated by the light-emitting points emits from the first side; and
a microlens array provided on the first side of the display screen, the microlens array comprises multiple microlenses arranged in an array, an orthographic projection of the microlens array on the display screen covers the display screen, and the display screen is provided on a focal surface of the microlens array;
wherein focal lengths of the multiple microlenses increase sequentially from a center of the microlens array to an edge of the microlens array, so that a beam width of the light that is emitted from each light-emitting point of the display screen, transmits through the microlens array and is incident into a pupil of a human eye is less than a preset threshold, wherein the microlens array satisfies $$p_{lens} \geq \sqrt{\frac{e \times p_{pixel}}{2} + a\lambda L}$$

$$f = \frac{L \times p_{lens}}{e}$$

$$N \geq \frac{\varphi \times f}{L \times p_{pixel}}$$

wherein, plens is an diameter of a microlens in the microlens array, e is a movable range of a single human eye, ppixel is a pixel interval of the display screen, a is a diffraction coefficient of the microlens, λ is a wavelength of light displayed on the display screen, L is a distance from the human eye to the microlens array, f is a focal length of the microlens at the center of the microlens array, N is a number of viewpoints entering the pupil of the single human eye, and φ is a diameter of the pupil of the human eye.

2. The display apparatus of claim 1, wherein the multiple microlenses are spherical lenses,
radius of curvature of the multiple microlenses increases sequentially from the center of the microlens array to the edge of the microlens array; and/or
arch rises of the multiple microlenses decreases sequentially from the center of the microlens array to the edge of the microlens array.

3. The display apparatus of claim 2, wherein the microlens array comprises multiple concentric annular regions, a center of the annular regions is the center of the microlens array, and the focal lengths of the microlens in the same annular region are identical.

4. The display apparatus of claim 3, wherein a difference between viewing angles for two adjacent annular regions with respect to the human eye is a preset value.

5. The display apparatus of claim 1, wherein the display screen comprises a plurality of pixel sets arranged in an array, the plurality of pixel sets is in one-to-one correspondence with the multiple microlenses, and a number of the light-emitting points in the pixel sets meets:

$$M = \frac{e \times N}{\varphi}$$

wherein M is the number of light-emitting points in the pixel set.

6. The display apparatus of claim 1, wherein the display screen is an OLED display screen, the OLED display screen comprises an organic light emitting layer, and the organic light emitting layer is disposed on a focal plane of the microlens array.

7. The display apparatus of claim 1, wherein the display screen is a liquid crystal display screen, the liquid crystal display screen comprises a color filter, and the color filter is arranged on a focal plane of the microlens array.

8. A virtual reality (VR) apparatus comprising the display apparatus of claim 1.

9. The VR apparatus of claim 8, wherein the microlens array comprises 6 annular regions, and a difference between viewing angles for two adjacent annular regions with respect to the human eye is 5°.

10. The VR apparatus of claim 9, wherein the microlenses in three annular regions adjacent to the center of the microlens array among the 6 annular regions have the same focal length, the same radius of curvature, and the same arch rise.

11. A display method, comprising:
providing a display screen, the display screen comprising multiple light-emitting points and a first side, wherein light generated by the light-emitting points emits from the first side; and
providing a microlens array on the first side of the display screen, the microlens array comprises multiple microlenses arranged in an array, an orthographic projection of the microlens array on the display screen covers the display screen, and the display screen is provided on a focal surface of the microlens array, focal lengths of the multiple microlenses increase sequentially from a center of the microlens array to an edge of the microlens array; and
the display screen displaying an image, a beam width of the light that is emitted from each light-emitting point of the display screen, transmits through the microlens array and is incident into a pupil of a human eye is less than a preset threshold, wherein the microlens array satisfies $$p_{lens} \geq \sqrt{\frac{e \times p_{pixel}}{2} + a\lambda L}$$

$$f = \frac{L \times p_{lens}}{e}$$

$$N \geq \frac{\varphi \times f}{L \times p_{pixel}}$$

wherein, plens is an diameter of a microlens in the microlens array, e is a movable range of a single human eye, ppixel is a pixel interval of the display screen, a is a diffraction coefficient of the microlens, λ is a wavelength of light displayed on the display screen, L is a distance from the human eye to the microlens array, f is a focal length of a microlens at the center of the microlens array, N is a number of viewpoints entering the pupil of the single human eye, and φ is a diameter of the pupil of the human eye.

12. The method of claim 11, wherein the multiple microlenses are spherical lenses,
radius of curvature of the multiple microlenses increases sequentially from the center of the microlens array to the edge of the microlens array; and/or
arch rises of the multiple microlenses decreases sequentially from the center of the microlens array to the edge of the microlens array.

13. The method of claim 12, wherein the microlens array comprises multiple concentric annular regions, a center of the annular regions is the center of the microlens array, and the focal lengths of the microlens in the same annular region are identical.

14. The method according to claim 13, wherein a difference between viewing angles for two adjacent annular regions with respect to the human eye is a preset value.

15. The method according to claim 11, wherein the display screen comprises a plurality of pixel sets arranged in an array, the plurality of pixel sets is in one-to-one correspondence with the multiple microlenses, and a number of the light-emitting points in the pixel sets meets:

$$M = \frac{e \times N}{\varphi}$$

wherein M is the number of light-emitting points in the pixel set.

* * * * *